United States Patent [19]

Tsironis

[11] Patent Number: 4,599,581
[45] Date of Patent: Jul. 8, 1986

[54] TEMPERATURE STABILIZING MICROWAVE OSCILLATOR CIRCUIT

[75] Inventor: Christos Tsironis, Yerres, France

[73] Assignee: U.S. Philips Corporation, New York, N.Y.

[21] Appl. No.: 614,186

[22] Filed: May 25, 1984

[30] Foreign Application Priority Data

Jun. 1, 1983 [FR] France .................. 83 09071

[51] Int. Cl.$^4$ .................. H03B 5/04; H03L 1/02
[52] U.S. Cl. .................. 331/66; 331/117 FE; 331/176
[58] Field of Search .................. 331/66, 117 FE, 176, 331/177 V

[56] References Cited

U.S. PATENT DOCUMENTS

| | | | |
|---|---|---|---|
| 3,697,890 | 10/1972 | Healey, III et al. | 331/177 V X |
| 4,015,219 | 3/1977 | Kawagoe et al. | 331/176 X |
| 4,187,476 | 2/1980 | Shinkawa et al. | 331/176 X |
| 4,369,417 | 1/1983 | Kupfer | 331/176 X |

FOREIGN PATENT DOCUMENTS

| | | | |
|---|---|---|---|
| 0064405 | 5/1980 | Japan | 331/176 |
| 0079506 | 6/1980 | Japan | 331/176 |

Primary Examiner—Eugene R. LaRoche
Assistant Examiner—D. C. Mis
Attorney, Agent, or Firm—Thomas A. Briody; William J. Streeter; Leroy Eason

[57] ABSTRACT

A temperature stabilizing circuit for a microwave oscillator employing a field effect transistor on an AsGa substrate, in which a temperature-stabilized frequency is obtained by varying the gate-channel capacitance of an FET included in the oscillator resonance circuit. The capacitance is controlled by a voltage derived from a voltage divider comprising a series arrangement of several Schottky diodes or FET's. The circuit is suited to assembly as an integrated monolithic circuit comprising FETs on a AsGa substrate, for micro wave frequency applications such as for example, processing 12 GHz satellite television signals.

6 Claims, 3 Drawing Figures

TEMPERATURE STABILIZING MICROWAVE OSCILLATOR CIRCUIT

BACKGROUND OF THE INVENTION

1. Field of the Invention

The invention relates to a circuit forming a capacitance which varies linearly with temperature.

The invention also relates to a temperature-stabilized micro wave frequency oscillator comprising a field effect oscillator transistor of the Schottky type to whose gate a resonance circuit is connected which determines the oscillator frequency including said capacitance.

2. Description of the Related Art

The invention may be utilized in head ends of television systems in which the television signals are transmitted via artificial satellites at a frequency of 12 GHz.

Within the scope of this application, a local oscillator is realized which deals with various technical problems.

In the first place the frequency supplied from the output of the oscillator must be very high (12 GHz) and very stable as well.

Secondly, the oscillator circuit must be simple and realizable at low cost as it is intended for mass production because of its use in the field of television.

These problems can be solved by providing a micro wave frequency oscillator whose frequency is stabilized versus temperature and which is monolythically integrable on a substrate made of, for example, gallium arsenide, which material has a high electronic mobility and consequently is the material which up to the present is most suitable for micro wave frequency applications.

A micro wave frequency oscillator circuit is disclosed in U.S. Pat. No. 4,333,062 dated June 1, 1982, filed on Dec. 27, 1979 by Matsushita Electric Industrial Co. (Japan). This known oscillator circuit comprises a field effect transistor whose frequency is stabilized by means of two microstrip resonators having a capacitance inserted in the middle of these microstrips.

These capacitances vary linearly versus temperature. One of these microstrip resonators functions as a band rejection filter and a load circuit of said oscillator. The other microstrip resonator functions as a serial resonator between a port of the oscillator and ground.

However, this device for oscillation frequency compensation versus temperature at a frequency of 2.2 GHz is absolutely not monolythically integrable as the capacitances employed are of necessity of a dielectric nature.

Actually, the circuit proposed by the above-mentioned Patent is realized in what is commonly referred to as a "hybrid" technique, which technique cannot be purely and simply transferred to integrated circuit techniques on gallium arsenide substrates, as these two techniques are based on different theories. The hybrid technique is based on the line theory and in essence comprises quarter-wave or half-wave lines which easily attain a length of 25 mm at the 12 GHz micro-wave frequency. Elements of such a length cannot be incorporated in an integrated circuit on gallium arsenide GaAs. The technique of providing integrated circuits on such a material only utilizes so-called lumped components, of some tenths or not more than some hundreds of $\mu m$. Although it is possible to realize capacitances of the so-called "interdigital" type, which are integrated on a GaAs substrate, such capacitances do not vary linearly with temperature.

SUMMARY OF THE INVENTION

An object of the invention is to provide a circuit forming a capacitance which varies linearly with temperature for temperature compensation of an oscillator at a microwave frequency of 12 GHz which can be integrated on the same substrate and with the same technique as the oscillator.

Such a circuit according to the invention is characterized in that this capacitance is formed by the input electrode-channel capacitance $C_v$ of an active element of the Schottky diode type, an output electrode thereof being coupled to a temperature-variable control voltage $V_v$, this control voltage $V_v$ being derived from a voltage divider comprising, successively connected between ground return and a d.c. supply voltage $V_c$, a first resistor $R_1$, a series arrangement of N diode-connected, active elements of the Schottky type in the blocking direction and a second resistor $R_2$, the first resistor $R$, being coupled to the output of the first-mentioned active element.

As the threshold voltage level for conduction of each of the N active Schottky elements decreases linearly with increasing temperature, the voltage $V_v$ produced at the output of the active compensating elements increases linearly with increasing temperature and proportionally to the number N.

When applying the circuit according to the invention it is possible with a proper choice of N to cause the input electrode-channel capacitance $C_v$ of the first-mentioned active element, hereinafter indicated as compensating element, to linearly vary adequately with temperature. The circuit according to the invention can be realized on a gallium arsenide substrate, for example with the aid of field effect transistors or diodes of the Schottky type, and may be incorporated in the frequency-adjusting circuit of a micro wave frequency oscillator.

The present invention has also for its object to provide a micro wave frequency oscillator as defined in the preamble, comprising such circuit. Such micro wave frequency oscillator according to the invention is characterized in that the resonance circuit which determines the oscillating frequency comprises a first inductance $L_1$ by which the gate of the oscillator transistor is coupled to an input electrode of an active compensating element of a circuit forming a linearly variable capacitance versus temperature and a second inductance $L_2$ at one end being coupled to ground and at the other end to the gate of the oscillator transistor.

When applying this circuit the variable capacitance of the active compensating element makes it possible to compensate for the phase and frequency variations of the oscillating transistor when the temperature varies.

A preferred embodiment of the micro wave frequency oscillator according to the invention stabilized as a function of the temperature is constituted, is characterized in that its active elements are of the Schottky type and its passive elements such as inductances, resistances and capacitances are lumped elements, which are monolythically integrated on a gallium arsenide substrate.

In accordance with another preferred embodiment of the invention the active compensating element is a transistor of the Schottky type and in accordance with a further preferred embodiment this element is a Schottky diode.

In accordance with another embodiment of the invention the N active elements are transistors of the Schottky type and in accordance with a still further preferred embodiment these elements are diodes of the Schottky type.

When applying said circuit a micro wave frequency oscillator can be realized which supplies a high and stable frequency, and is competitive in both the technical and the commercial fields.

BRIEF DESCRIPTION OF THE DRAWINGS

Particulars and advantages of the invention and embodiments thereof will become more apparent from the following description which is given by way of example with reference to the accompanying Figures.

DESCRIPTION OF THE PREFERRED EMBODIMENTS

Figure 1:
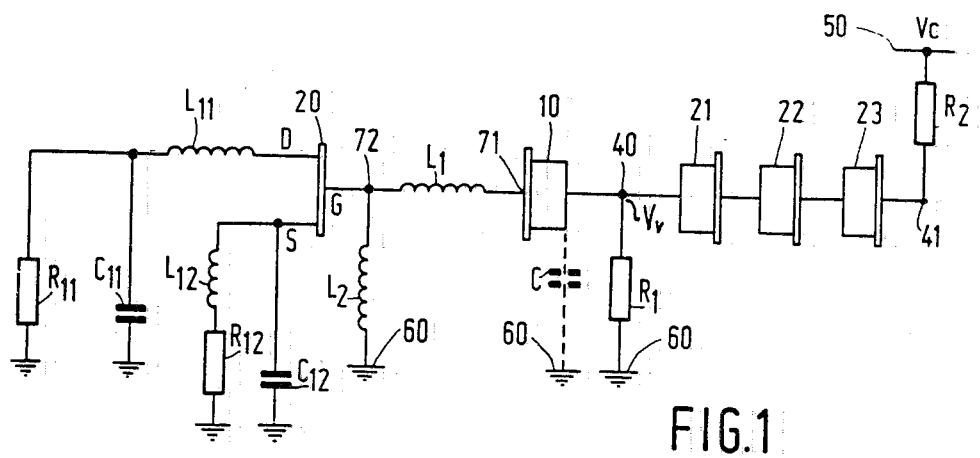
FIG. 1 shows a micro wave frequency oscillator in accordance with the invention whose temperature compensating circuit is realized with the aid of Schottky field effect transistors.

The arrangement of FIG. 1 shows an oscillating field effect transistor 20 whose gate 72 is coupled on the one hand through a first inductance $L_1$ to a gate 71 of a diode-connected compensating field effect transistor (FET) 10 and on the other hand to a second inductance $L_2$, whose other end is connected to ground 60. The drain and the source of the FET 10 are mutually short-circuited and coupled to an output 40 of a voltage divider $R_1$, 21-23, $R_2$, comprising a first resistor $R_1$, one end being connected to the output 40 and the other end to ground 60, and also comprising between said output 40 and a d.c. supply voltage 50 a series arrangement of first, second and third FET's respectively referenced 21, 22, and 23 and a second resistor $R_2$. Each of said FET's 21, 22 and 23 is diode-connected, i.e. the drain and source electrodes being shortcircuited. The shortcircuited drain-source electrodes of the first FET 21 is coupled to the output 40, the shortcircuited drain-source electrodes of FET's 22 and 23 are respectively coupled to the gates of FET's 21 and 22 and the gate of the third FET 23 coupled through the second resistor $R_2$ to said d.c. supply voltage 50.

The inductance $L_1$ and $L_2$ and the gate-channel capacitance of the FET 10 form the resonance circuit which determines the oscillating frequency of the oscillating transistor 20.

A circuit comprising a series arrangement of an inductance $L_{12}$ and a resistor $R_{12}$, which series arrangement is shunted by a capacitor $C_{12}$ and connected between ground and the source electrode of the oscillating transistor 20 is used for sustaining the oscillation conditions.

A circuit comprising a capacitor $C_{11}$ and an inductance $L_{11}$ arranged between ground and the drain of the oscillating transistor 20 is used for an impedance match which makes it possible to optimize the output power of the oscillator, a resistor $R_{11}$ connected between ground and the common point of $L_{11}$ and $C_{11}$ being the load impedance.

An oscillator without the temperature compensating circuit comprising voltage divider $R_1$, 21-23 and $R_2$, whose oscillation conditions and whose output power optimization are realized at the source and the drain by simular oscillatory circuits, is disclosed in the prior art paper by C. Tsironis, published in Electronics Letters, Apr. 15, 1982, (Vol. 18, no. 8, pages 345–347).

Figure 2:
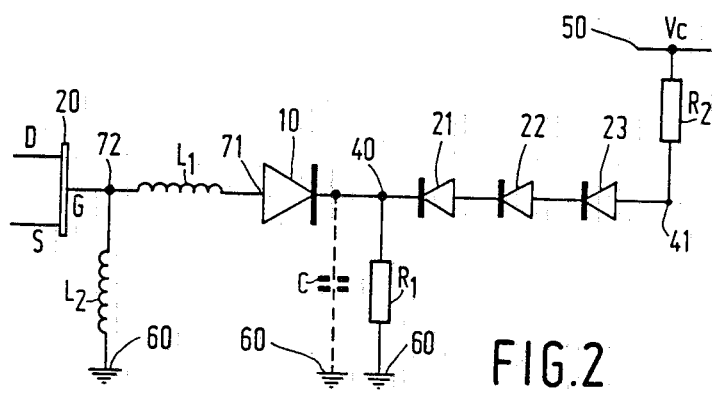
FIG. 2 shows such a temperature compensating circuit realized with the aid of Schottky diodes.

FIG. 2 shows the same circuit as FIG. 1 but in which Schottky diodes replace the FET's.

The mode of operation of the circuit of FIG. 1 or of FIG. 2 is based on the fact that in either of them a capacitance of a high value C appears between the short-circuited drain-source output electrode(s) of the active compensating element 10 and ground 60, for micro wave frequencies.

The diode-connected FET 10 in FIG. 1 and the Schottky diode 10 in FIG. 2 operate in the blocking direction. The d.c. polarizing voltage $V_v$ applied to the channel of FET 10 at the output 40 of the voltage divider $R_1$, 21-23 $R_2$ is controlled by the series arrangement of active elements 21-23, which can be diode-connected FET's 21-23 as shown in FIG. 1 or Schottky diodes 21, 22, 23 as shown in FIG. 2 in such manner as to cause the gate-channel capacitance of the active compensating element 10 to vary by a desired quantity. The resistors $R_1$ and $R_2$ are used for adjusting this polarizing point at a reference value for a predetermined temperature.

The threshold voltage of the FET's or the diodes 21, 22, 23 varies versus temperature in accordance with a known linear law. It decreases linearly with increasing temperature by 2 mV/°C. for a constant current and per Schottky element.

Figure 3:
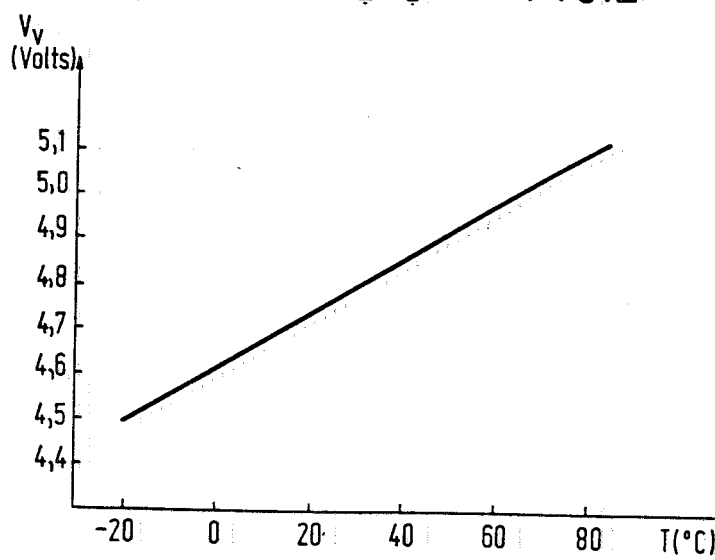
FIG. 3 illustrates by means of a curve the variations of the control voltage $V_v$ for the active compensating elements versus temperature T for a predetermined number $N=3$ of such elements in the beforementioned series arrangement.

Measurement effected on the arrangement described here have shown that the voltage $V_v$ which must be applied to the channel of the transistor 10 between −20° and 80° C., should increase linearly with increasing temperature by 6 mV/°C. as is shown in the graph of FIG. 3 by means of a solid line.

This leads to choosing the number N of the series arrangement of FET's or the Schottky diodes 21-23 to be equal to 3.

The temperature dependent variation of the voltage $V_v$ attained at output 40 of the voltage divider $R_1$, 21-23, $R_2$ is therewith matched to the linear temperature dependent variation of the gate-channel capacitance of transistor 10, which accomplishes an excellent temperature compensation of the oscillator for a frequency of 12 GHz, at temperatures comprised between −20° and +80° C.

It should be noted that the Schottky FET or the Schottky diodes are perfectly integrable on an AsGa-substrate, which also holds for the resistors which are realized by implanting a resistive layer in the substrate. Finally, the inductances $L_1$ and $L_2$ are integrable as micro-strip lines having a spiral shape, and the fixed capacitors in the form of interdigital structures.

In a monolythically integrated embodiment on gallium arsenide, elements have been used which evidence the characteristics included in the Table shown on this page.

It will be obvious that the invention is not limited to 12 GHz satellite TV systems and that numerous variations are possible without departing from the scope of the present invention as defined in the following claims.

The parameters of examples of circuits in accordance with FIGS. 1 and 2 are as follows:

| Transistors or diodes | 20 | 10 | 21 | 22 | 23 |
|---|---|---|---|---|---|
| Gate width | 300 μm | " | " | " | " |
| Gate length | 1 μm | | | | |
| Threshold voltage | 3,5 V | | | | |
| Capacitors | $C_{11}$ | $C_{12}$ | | | |
| Values | 0,2 pF | 0,3 pF | | | |
| Resistors | $R_1$ | $R_2$ | $R_{11}$ | $R_{12}$ | |
| Values | 330k Ω | 220k Ω | 50 Ω | 40 Ω | |
| Inductances | $L_1$ | $L_2$ | $L_{11}$ | $L_{12}$ | |
| Values | 1,5 nH | 1 nH | 0,5 nH | 5 nH | |
| D-C supply voltage | | $V_c = 6,5$ | | | |
| Operating frequency | | F = 12 GHz | | | |

I claim:

1. A circuit for temperature-stabilizing the frequency of a Schottky type FET microwave oscillator by forming a capacitance which linearly varies with temperature so as to compensate for the temperature variation of the oscillator FET, comprising:

an active semiconductive device of the Schottky type having an output electrode and an input electrode;

a voltage divider for applying a temperature-variable control voltage to the output electrode of said semiconductive device; said voltage divider comprising, connected in series between ground and a source of direct supply voltage, a first resistor, a succession of active diode-connected elements of the Schottky type connected in the blocking direction, and a second resistor;

said first resistor being connected between ground and the output electrode of said semiconductive device;

means for coupling the input electrode of said semiconductive device to the oscillator FET;

and each of said diode-connected elements having a threshold voltage level for conduction which linearly decreases with increasing temperature;

whereby the capacitance-to-ground of the input electrode of said semiconductive device is linearly varied with temperature by said control voltage so as to compensate for the temperature variation of the oscillator FET.

2. A circuit as claimed in claim 1, characterized in that each of said active diode-connected elements is a Schottky field effect transistor the drain and souce electrodes of which are shortcircuited together.

3. A circuit as claimed in claim 1, characterized in that said active diode-connected elements are Schottky diodes.

4. A circuit as claimed in any of the claims 1, 2 or 3, characterized in that it is integrated on a gallium-arsenide substrate.

5. A microwave oscillator the frequency of which is stabilized against temperature variation, comprising:

a resonant circuit which determines the operating frequency of said oscillator and which comprises a first inductance and a Schottky type FET, the gate electrode of the FET being connected to one terminal of the first inductance and the other terminal of the first inductance being connected to ground;

an active semiconductor device of the Schottky type having an input electrode and an output electrode;

a second inductance connecting the input electrode of the semiconductive device to the gate electrode of the FET;

a voltage divider for applying a temperature-variable control voltage to the output electrode of the semiconductor device; such voltage divider comprising, connected in series between ground and a source of direct supply voltage, a first resistor, a succession of active diode-connected elements of the Schottky type connected in the blocking direction, and a second resistor;

said first resistor being connected between ground and the output electrode of said semiconductive device;

and each of said diode-connected elements having a threshold voltage level for conduction which linearly decreases with increasing temperature;

whereby the gate-channel capacitance of said semiconductive device is linearly varied with temperature by said control voltage, resulting in a temperature variation of the capacitance-to-ground of the input electrode of said semiconductive device which compensates for the temperature variation of the oscillator FET.

6. A circuit as claimed in claim 5, characterized in that it is monolythically integrated on a gallium-arsenide substrate.

* * * * *